(12) United States Patent
Babikian et al.

(10) Patent No.: US 6,509,577 B1
(45) Date of Patent: Jan. 21, 2003

(54) SYSTEMS AND METHODS FOR EXPOSING SUBSTRATE PERIPHERY

(75) Inventors: Dikran Babikian, Millbrae, CA (US); Larry Stark, San Jose, CA (US); Bryan Wade, Half Moon Bay, CA (US)

(73) Assignee: ASML US, Inc., San Jose, CA (US)

( * ) Notice: Subject to any disclaimer, the term of this patent is extended or adjusted under 35 U.S.C. 154(b) by 50 days.

(21) Appl. No.: 09/709,975

(22) Filed: Nov. 10, 2000

(51) Int. Cl.[7] ................................................. G01V 8/00
(52) U.S. Cl. .............................. 250/559.36; 250/559.29
(58) Field of Search ....................... 250/559.36, 559.29, 250/559.3, 559.37; 355/53, 55; 356/615

(56) References Cited

U.S. PATENT DOCUMENTS

| | | | | |
|---|---|---|---|---|
| 5,229,811 A | * | 7/1993 | Hattori et al. | 355/50 |
| 5,361,121 A | * | 11/1994 | Hattori et al. | 355/50 |
| 5,420,663 A | * | 5/1995 | Nakajima et al. | 355/50 |
| 5,811,211 A | * | 9/1998 | Tanaka et al. | 430/30 |
| 5,982,474 A | * | 11/1999 | Akiyama et al. | 355/53 |
| 6,249,382 B1 | * | 6/2001 | Komatsuda | 359/618 |

* cited by examiner

*Primary Examiner*—Robert H. Kim
*Assistant Examiner*—Irakli Kiknadze
(74) *Attorney, Agent, or Firm*—Robert Moll

(57) ABSTRACT

The present invention describes systems and methods for exposure and removal of material on the periphery of a substrate. The system includes an emitting radiation or exposure source, preferably a guide such as an optical assembly and an emitter, an edge detector, a transport, which comprise rotating and radial mechanisms, and a substrate support. The optical assembly directs radiation from the exposure source to the wafer or emitter. The transport supports the emitter and the edge detector about the substrate, and a tracking exposure head preferably supports the emitter and edge detector. As the emitter moves along the periphery of the substrate, the edge detector sends signals to control systems, which process signals, and command the transport to adjust the position of the emitter when necessary to expose the periphery of the substrate. In another embodiment, the system provides an exposure source chamber, a process chamber, and optionally a control chamber to isolate particle and thermal problems. In another embodiment, the wafer is in a rotating drum, which supports a radial mechanism, supporting a tracking exposure head holding the emitter and edge detector. The drum and tracking exposure head have guidance components and stopping mechanisms.

25 Claims, 13 Drawing Sheets

SYSTEMS AND METHODS FOR EXPOSING SUBSTRATE PERIPHERY

BACKGROUND OF THE INVENTION

This invention relates to systems and methods for exposing material on the periphery of a substrate.

In the manufacture of integrated circuits (ICs) and semiconductor devices, the process of spin coating is used to apply photoresist (resist) on semiconductor wafers. Spin coating places a wafer on a chuck, dispenses resist on the wafer, and spins the wafer to distribute a thin film of resist over the surface of the wafer. The centrifugal force distributes resist onto the periphery of the wafer, but some ICs and devices cannot be made in the periphery. In fact, wafer handlers, pick-and-place machines and wafer cassettes may contact the periphery, causing resist to peel off and contaminate the wafer.

To prevent these problems, systems have been designed to expose and remove the resist on the periphery. One system includes a chuck for rotating a wafer located below a non-rotating fiber optic emitting exposing light at the periphery of the wafer. A non-rotating sensor detects the wafer edge and sends signals to memory of a control system after traversing the edge of the entire wafer, a process referred to as wafer mapping. After wafer mapping, the control system sends signals based on the stored signals to a radial transport arm, which moves the fiber optic in the radial direction to control the depth of exposure on the wafer.

This system has several problems. The rotating chuck assembly can generate airborne particles, which contaminate the wafer, and heat, which impacts the wafer temperature uniformity. Wafer mapping requires additional time and thus reduces throughput. Further, failure to isolate the wafer from the heat generated by the lamp of the exposure source assembly and from the controller subjects the wafer to unnecessary heat and particle contamination.

An ideal system today should be able to accurately expose the periphery of different diameter wafer such as 200 mm and 300 mm with notches, clips, flats and/or edge irregularities, expose a predetermined width, such as from 0.5 mm to 10 mm from the wafer edge, have high throughput such as 100 or more wafers per hour, and make sharp transitions from exposed to non-exposed resist without varying the temperature uniformity in a contamination free environment. It should be easy to maintain, operate, manufacture, reliable, and compact.

SUMMARY OF THE INVENTION

The invention provides systems and methods of exposing the periphery of a substrate. In an embodiment, the system includes an exposure source coupled to a guide directing radiation to a wafer, an edge detector, a transport, a support, and a control system. The guide includes a fiber optic and/or an optical system such as a catadioptric optical assembly. The transport moves the guide along the periphery of the substrate during exposure. The transport may achieve this by radial and rotating mechanisms. In one embodiment, the rotating mechanism supports the radial mechanism supporting the guide and the edge detector. The edge detector sends signals to a control system, which processes the signals and controls the transport to adjust the position of the emitting guide when necessary to expose the periphery.

In other embodiments, the system includes an exposure source chamber, a process chamber, and a control chamber to isolate the substrate from particulate and thermal contamination. The rotating mechanism may include a drum to house the substrate and support the radial mechanism. The radial mechanism preferably supports a tracking exposure head holding the edge detector and the guide emitter adjacent the substrate. The rotating and the radial mechanisms move the emitter and the edge detector subject to guidance and stopping mechanisms. A fiber optic assembly preferably directs radiation from an exposure source to the wafer. The edge detector provides signals to control the tracking exposure head to adjust for edge irregularities.

DETAILED DESCRIPTION OF THE PREFERRED EMBODIMENTS

Figure 1:
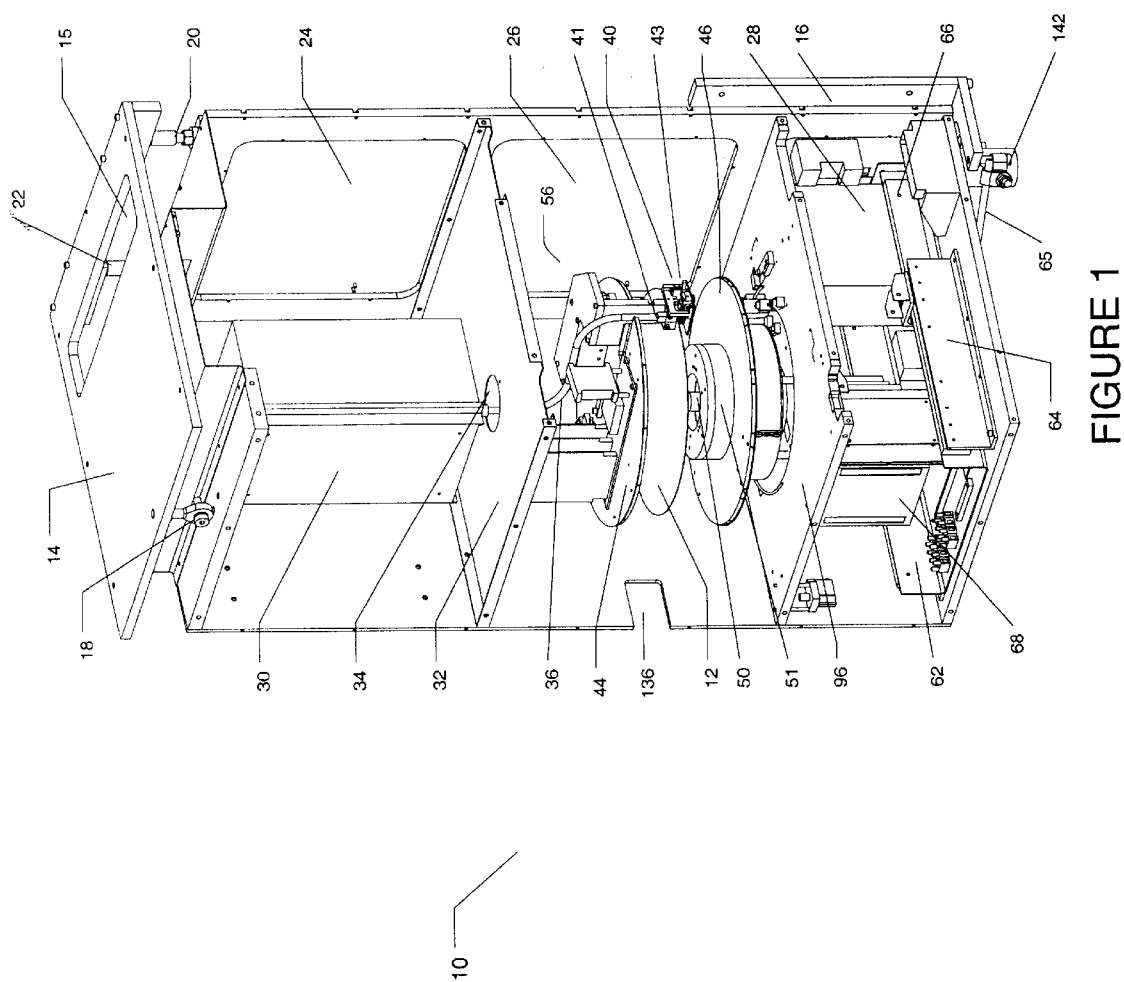
FIG. 1 is a perspective view of the system, which removes enclosure walls to illustrate the components in the exposure, process, and control chambers of the system.

FIG. 1 illustrates a system 10 to expose and remove radiation-sensitive material on the periphery of a substrate. For brevity, we describe exposure of resist on semiconductor wafers, but other applications are possible. The system 10 includes a mounting plate 14, with a passage 15, and a pair of L-shaped brackets 16 (one shown) to secure the system 10 to a rigid frame (not shown), and a leveling arm 65. A set of module holding and level arms 18, 20, and 22 level the system 10 to a load/unload robot, not shown. An exposure source chamber 24 houses an exposure source assembly 38 (FIG. 2B), a process chamber 26 houses a wafer 12 during exposure, and a control chamber 28 houses a control system.

FIG. 1 shows the exposure source chamber 24, the process chamber 26, and the control chamber 28 as stacked from top to bottom, but this arrangement is not essential. Each chamber preferably includes access for service and maintenance. The three-chambers isolate heat generated in the exposure source chamber 24 and in the control chamber 28 from the process chamber 26.

The exposure source chamber 24 contains an inner enclosure 30, protecting the exposure source assembly 38 (FIG. 2B) and providing a safety barrier to touching the exposure source assembly 38 when the access door is removed. If the exposure source assembly 38 contains an ultraviolet (UV) light source, the inner enclosure 30 also encloses UV radiation for operator safety. The inner enclosure 30 also helps manage thermal and particulate contamination. Process requirements determine what exposure source is used. For example, mercury lamps, such as mercury xenon and excimer lasers can expose the resist on wafers. More specifically, a suitable exposure source for deep ultraviolet resist centered on 248 nm is the Hypercure 200 manufactured by Hologenix in Huntington Beach, Calif. A suitable inner enclosure 30 and exposure source assembly 38 can be obtained as a single unit from Optical Associates, Inc. (OAI) of Milpitas, Calif. (e.g., part no. 0860-0041-01).

The exposure source chamber 24 has a floor 32 with a passage 34 leading to the process chamber 26. Cooling gas such as air is drawn from the process chamber 26 through the passage 34 to cool the inner enclosure 30 and prevent particulate from falling through passage 34 into the process chamber 26. A duct 140 (FIG. 8) also pulls gas such as air from the process chamber 24 and is connected to the exhaust 142 from control chamber 28.

Figure 2A:
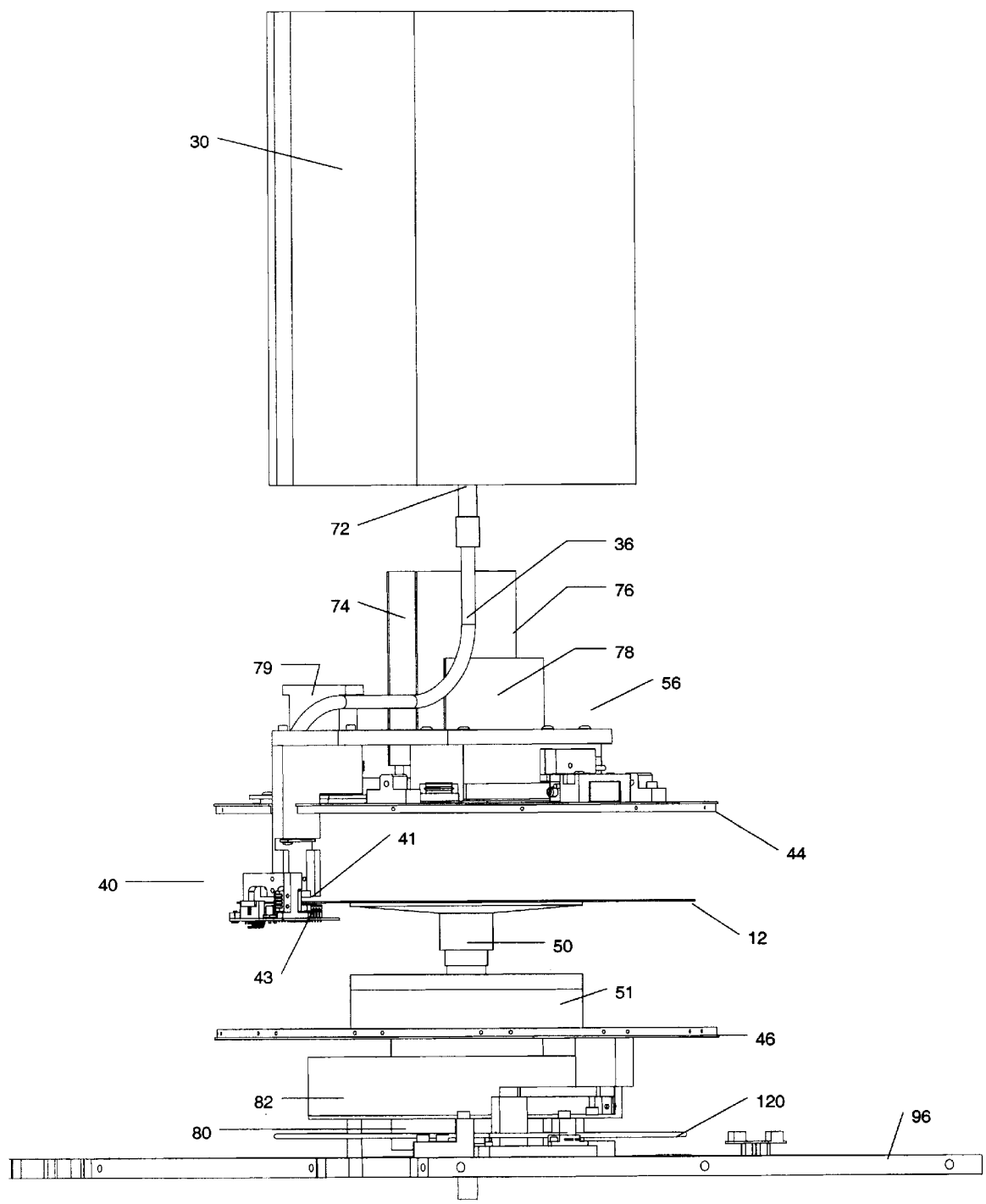
FIG. 2A is an elevation view illustrating the system of FIG. 1.
Figure 3:
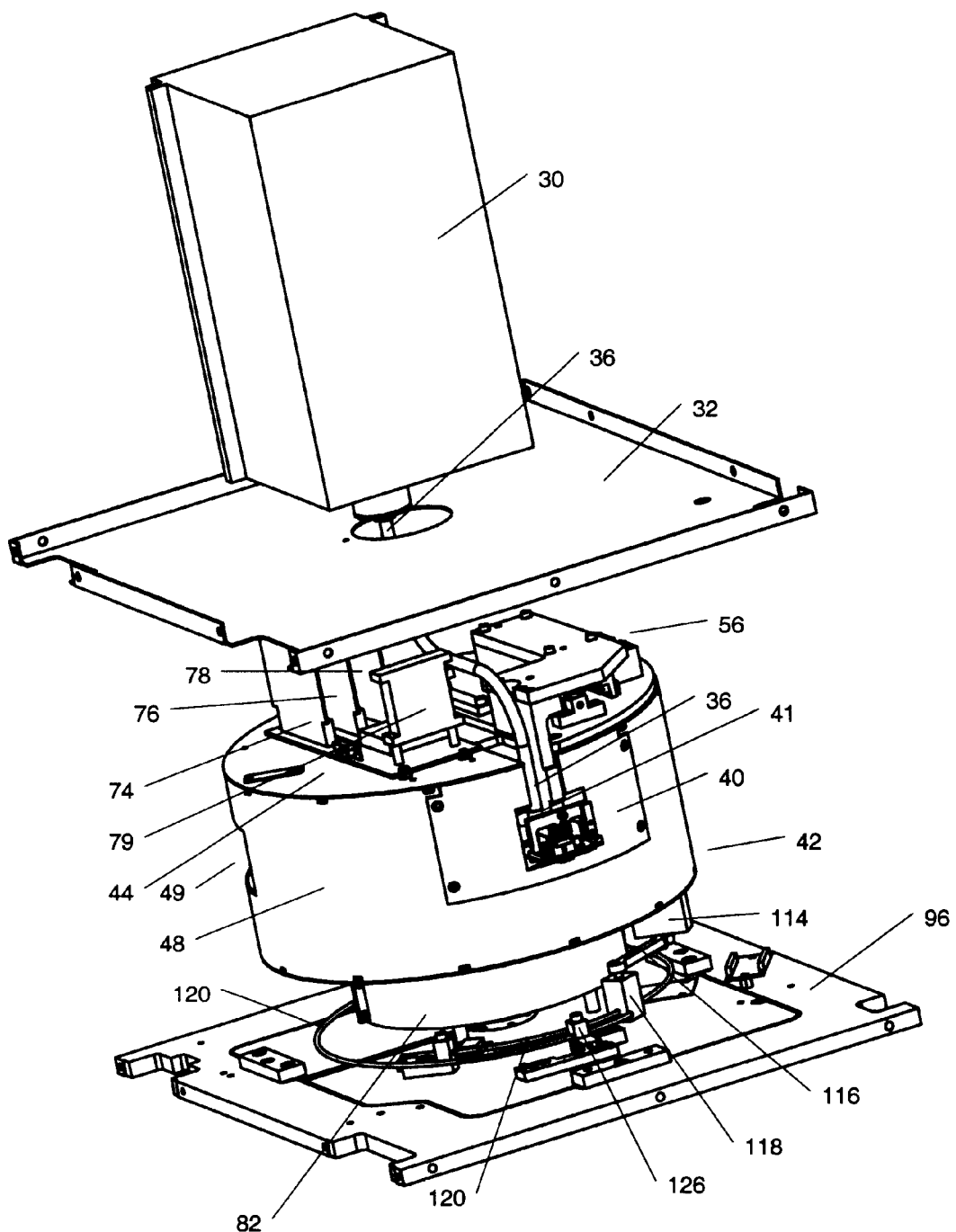
FIG. 3 is a perspective view of the system illustrating the inner enclosure housing the exposure source assembly shown in FIG. 2B, and a guide leading from the source to the emitter supported by a tracking exposure head located adjacent a rotating drum.
Figure 4:
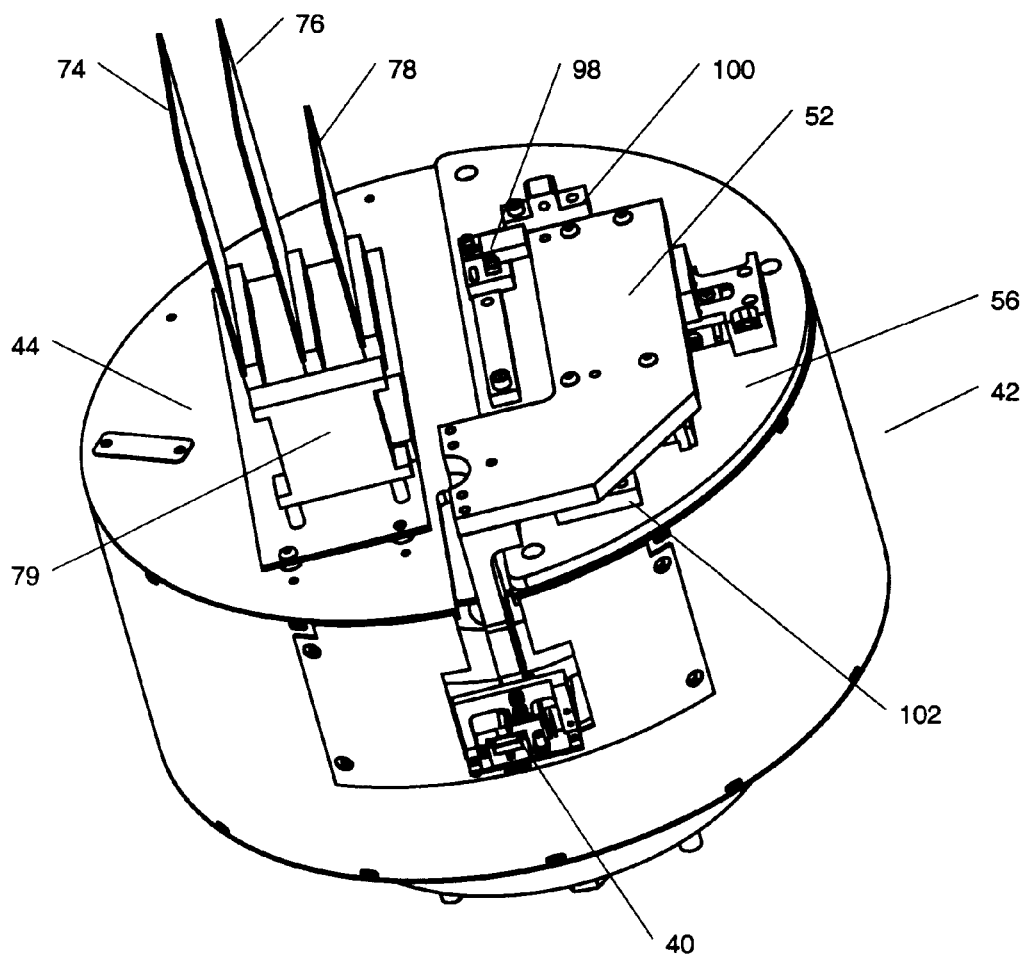
FIG. 4 is a perspective view of the rotating drum shown in FIG. 3, with details regarding components mounted on the rotating drum.

FIGS. 1 and 2A illustrate a transport for moving an emitter 41 emitting radiation and an edge detector 43 along the periphery. The emitter 41 is part of and/or compatible with a fiber optic and/or an optical system as will be discussed below. As shown in FIGS. 2A and 3–4, the transport includes a rotating mechanism and a radial mechanism. The rotating mechanism includes a drum 42, including an upper cover 44, a lower cover 46, and a wall 48 with a wafer passage 49, to reduce particle contamination on the wafer 12. As the rotating mechanism rotates, the emitter 41 rotates about the periphery of the wafer 12. Although a rotating drum is the preferred, FIGS. 1 and 2A show the rotating mechanism can be just the upper cover 44 or a rigid non-contaminating structure capable of controlled rotation adjacent the wafer 12. The radial mechanism 56 transports the emitter 41 and an edge detector 43 over the wafer 12 in the radial direction, but is located over the upper cover 44 to reduce particle contamination of the wafer 12. In the preferred embodiment a tracking exposure head 40 supports the emitter 41 and the edge detector 43.

The control chamber 28 includes a pair of parallel guides 62, 64 for rollout of an electronics tray 66 supporting a main control system 68 including a computer preferably but not necessarily capable of interfacing with standard storage and peripherals and input devices such as a mouse, a keyboard and/or keypad, and standard output devices such as a display and/or a printer. The control chamber 28 includes an exhaust duct 142 to remove heat generated by the main control system 68. The process chamber 26 includes a wafer passage 136 for loading and unloading the wafer 12 on and off the chuck 50 supported by a base 51.

Figure 2B:
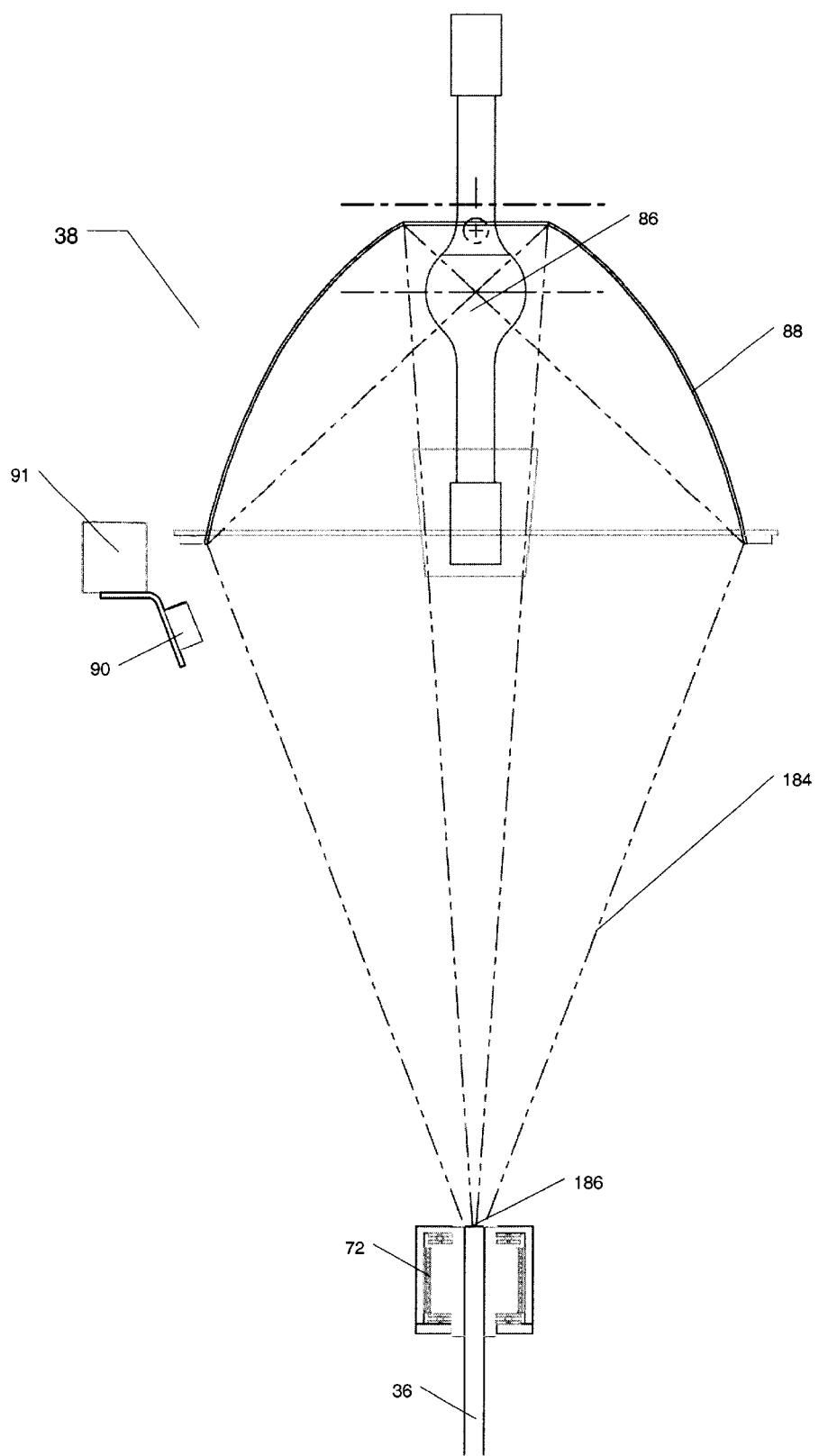
FIG. 2B is a schematic of the exposure source assembly in an inner enclosure in the exposure source chamber.

FIG. 2A is an elevation view of the system 10 shown in FIG. 1. FIGS. 2A–2B illustrate that the fiber optic assembly 36 terminates in a roller and thrust bearing assembly 72 in the inner enclosure 30. The fiber optic assembly 36 spins in the roller and thrust bearing assembly 72 when a rotating mechanism such as drum 42 (FIGS. 3–4) rotates. FIG. 2A shows the fiber optic assembly 36 leads down to the emitter 41 on the tracking exposure head 40 adjacent the wafer 12.

The upper cover 44 supports an r-axis servo controller printed circuit board (PCB) 74, a charge coupled device (CCD) counter PCB 76, an amplifier PCB 78, and an amplifier resonator 79. OAI provides a suitable servo controller PCB 74 (e.g., OAI part no. 080-0005-01) and a CCD counter PCB 76 (e.g., OAI part no. 0860-0003-01). The CCD counter PCB 76 incorporates a 13-micron pitch CCD such as OAI part no. 5500-007-01, which communicates with a CCD sensor chip 59, which is supported on the tracking exposure head 40. One suitable sensor chip 59 is part no. 08600002-02 made by OAI. Amplifier PCB 78 and amplifier resonator 79 function as a motor amplifier driving the radial mechanism motor 56.

Nanomotion, Ltd of Yokneam, Israel makes a suitable amplifier PCB 78 (e.g., OAI part no. 4900-116-01) and a suitable amplifier resonator 79 (e.g., OAI part no. 4900-118-01).

The dedicated controller PCBs 74, 76, and 78 locations on the upper cover 44 reduce the number of lines from the main computer 68 to the radial mechanism 56. The CCD counter PCB 76 communicates with a CCD sensor 59 on a PCB supported by the tracking exposure head 40. Each controller PCB 74, 76, and 78 preferably includes a conventional particulate cover not shown.

FIG. 2A shows a rotary motor 80 for rotating the drum 42. A drum and cable tray 82 located below the lower cover 46 stores a flat cable (not shown), which carries power and control lines from the control chamber 28 to the motor 80 as well as to the controller PCBs 74, 76, and 78. The flat cable is arranged in a spiral in the drum rotary motor and cable tray 82 to permit the flat cable to wind up and unwind as the drum 42 rotates without stressing the flat cable. The flat cable exits the tray 82 and is secured to the cylindrical wall 48 of the rotating drum 42 and to the controller PCBs 74, 76, and 78.

FIG. 2B illustrates details of the exposure source assembly 38. The exposure source assembly 38 includes a lamp 86, e.g., the mercury lamp mentioned earlier, in a UV optimized reflector 88 and supported by an inner enclosure frame 91, partially shown. One suitable lamp 86 is OAI part no. 3800-162-01. A lamp intensity probe 90, next to the reflector 88 and the frame 91, monitors the exposure energy output of the lamp 86 so it can be replaced before output falls below requirements. One suitable probe 90 is the OAI part no. 0860-0030-01, preferably traceable to and calibrated at the United States National Institute of Standards and Technology (NIST). NIST traceable means NIST documents the calibration and the equipment used to calibrate the probe 90. The reflector 88 is preferably a detachable part of the exposure source assembly 38. Thus, in this preferred embodiment, replacing the reflector 88 will not require replacing the lamp 86. The reflector 88 focuses radiation from the lamp 86 in a cone shape 184 whose apex 186 aligns to fill the source end of the fiber optic assembly 36 within the roller bearing 72.

FIG. 3 is a perspective view of the system 10 with the enclosure walls removed to illustrate components of the exposure source chamber 24 and the process chamber 26. FIG. 3 shows the inner enclosure 30, the floor 32 separating the exposure source chamber 24 and the process chamber 26, the fiber optic assembly 36, the rotating drum 42, the tracking exposure head 40, the emitter 41, the radial mechanism 56, the controller PCBs 74, 76, and 78, the resonator module 79, the upper cover 44, the rotating drum wall 48, the wafer passage 49, the rotary drum and cable tray 82, the floor 96 separating the process chamber 26 from the control chamber 28, the rotary limit switch guide wire 120, the block follower 114, the arm follower 116, the block follower guide 118, and the guide block 126. The components in the lower portion of the process chamber 26 will be further discussed in connection with FIG. 7.

Figure 5:
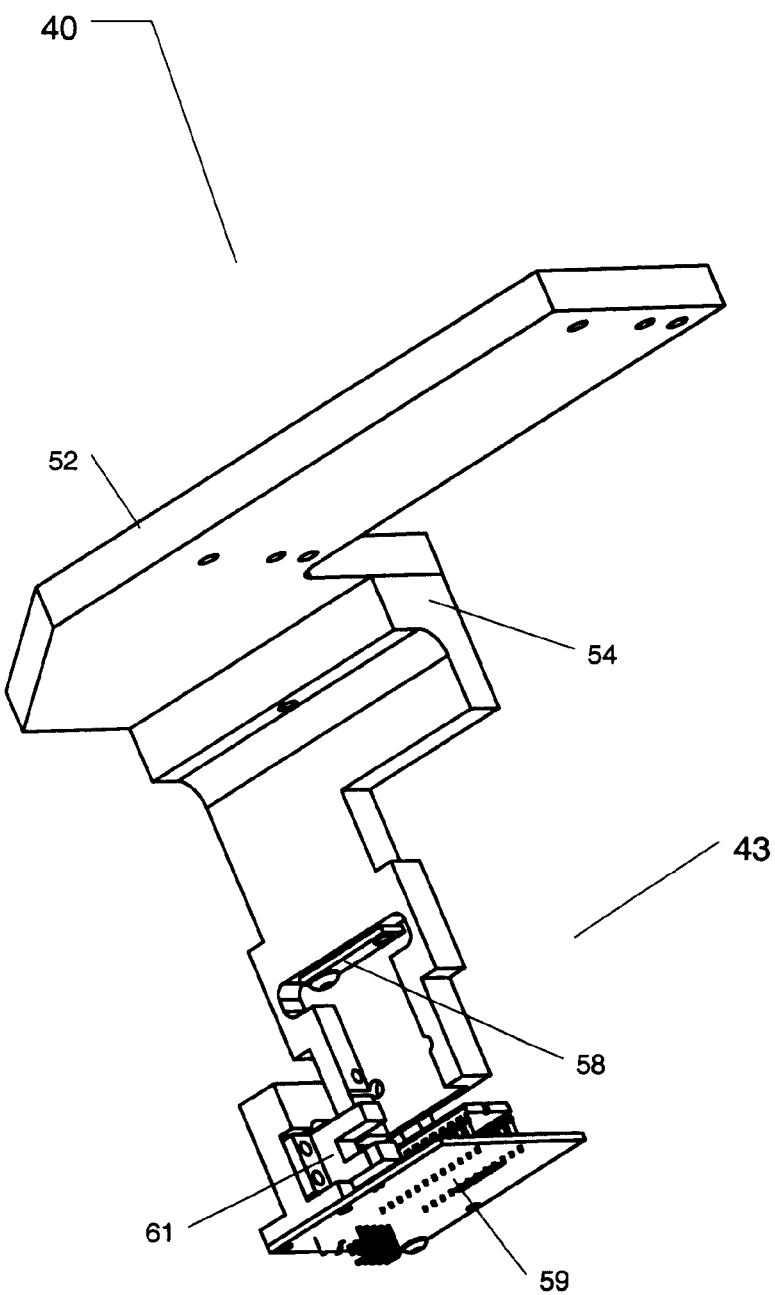
FIG. 5 is a perspective view of an embodiment of the tracking exposure head.
Figure 6:
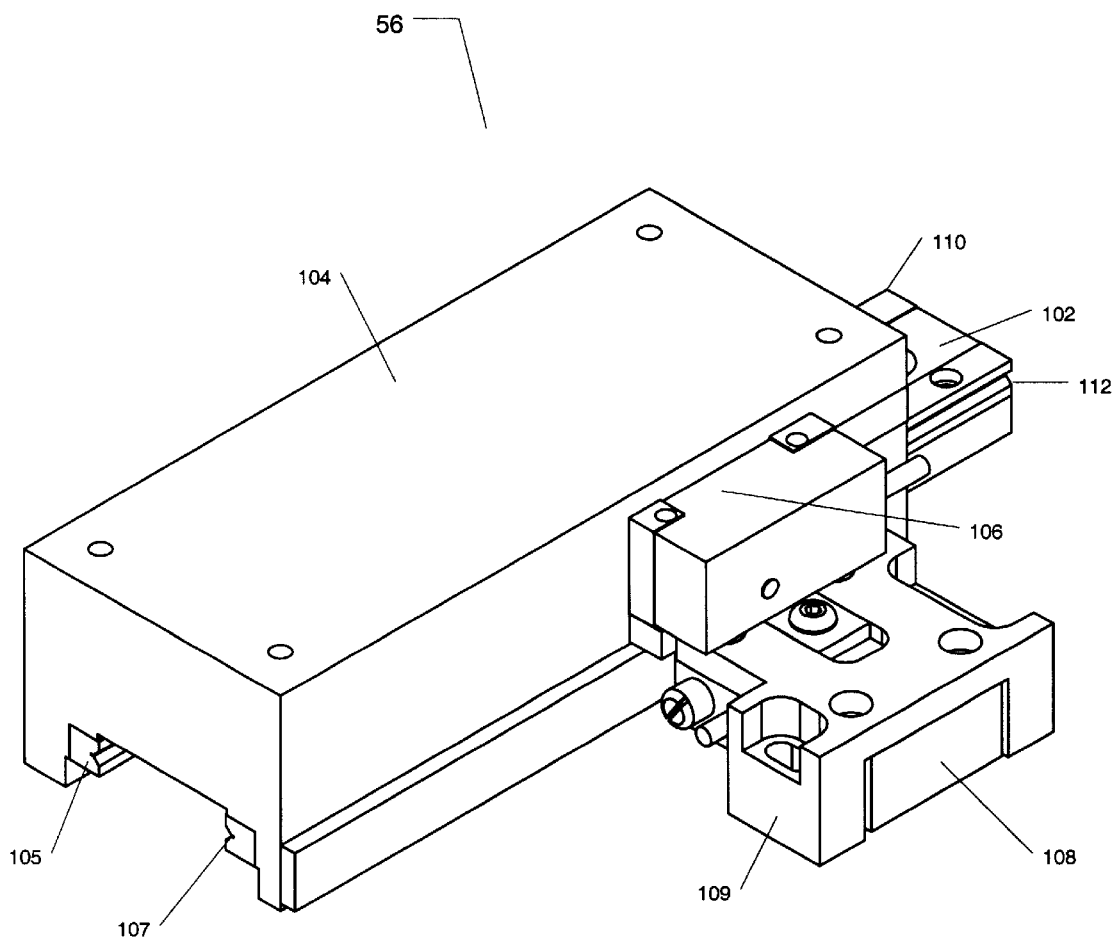
FIG. 6 is a perspective view of an embodiment of the top portion of a radial mechanism. It illustrates the slides, the rails, the linear encoder and motor used to move the tracking exposure head.

FIGS. 4–6 show details of the components of the system 10. FIG. 4 illustrates that the upper cover 44 supports the controller PCB 74, 76, and 78, and the radial mechanism 56, including a photo sensor 98 and slide stop block 100, to prevent the L-shaped plate 52 from sliding too far in operation in accordance with control signals from the photo sensor 98. The photo sensor 98 also determines the home position of the radial mechanism 56. The home position and the functions of the controller PCB 74, 76, and 78 will be further described below in connection with FIGS. 10–11.

FIG. 5 is a perspective of the tracking exposure head 40, which supports the emitter 41 (FIG. 1) and the edge detector 43. The tracking exposure head 40 includes a bracket 54 attached or integral and perpendicular to the L-shaped plate 52. The bracket 54 supports the edge detector 43 including a light emitting diode (LED) 58 facing the CCD sensor 59. The CCD sensor 59 captures radiation from the LED 58 not covered by wafer 12 to detect the edge of the wafer 12 as will be described. A suitable LED 58 is OAI part no. 080-0018-01.

A crash sensor 61 detects obstructions in the path of the tracking exposure head 40, and triggers a protection logic 164 as discussed below in connection with FIG. 11, which commands the motor 108 to stop further radial movement of the tracking exposure head 40 until the obstruction is cleared.

FIGS. 4–6 show the radial mechanism 56 is attached to the L-shaped plate 52 of the tracking exposure head 40. As shown in FIG. 5, the radial mechanism 56 itself includes a fixed slide base 102, mounted on the upper cover 44, and a slide carriage 104 with outer cross roller bearing rails 105 and 107, sliding on parallel inner cross roller bearing rails 110 and 112 of the fixed slide base 102. A linear encoder 106, a piezo-ceramic linear motor 108 supported by an encoder-motor mating bracket 109, and an encoder tape (not shown) bonded to the side of the movable slide carriage 104 and adjacent to the linear encoder 106 provide controlled radial movement of the tracking exposure head 40 with respect to the wafer 12. One suitable radial mechanism 56 is OAI part no. 0860-0010-01.

The radial mechanism 56 transports the tracking exposure head 40 supporting the emitter 41 into position for exposure of the periphery of the wafer 12, and the edge detector 43 comprising the CCD sensor 59 and the LED 58. The linear encoder 106 measures the position of the sliding carriage 104 of the radial mechanism 56, which indicates the position of the CCD sensor 59. The CCD sensor 59 signals are a function of the linear position of the slide carriage 104 and the tracking exposure head 40. For example, if the motor 108 moves the radial mechanism 56 10 mm toward the center of the wafer 12, the CCD sensor 59 will see 10 mm more of the wafer 12, that is, the wafer 12 will block some calculable amount of light from the LED 58 from being captured by the CCD sensor 59.

Figure 7:
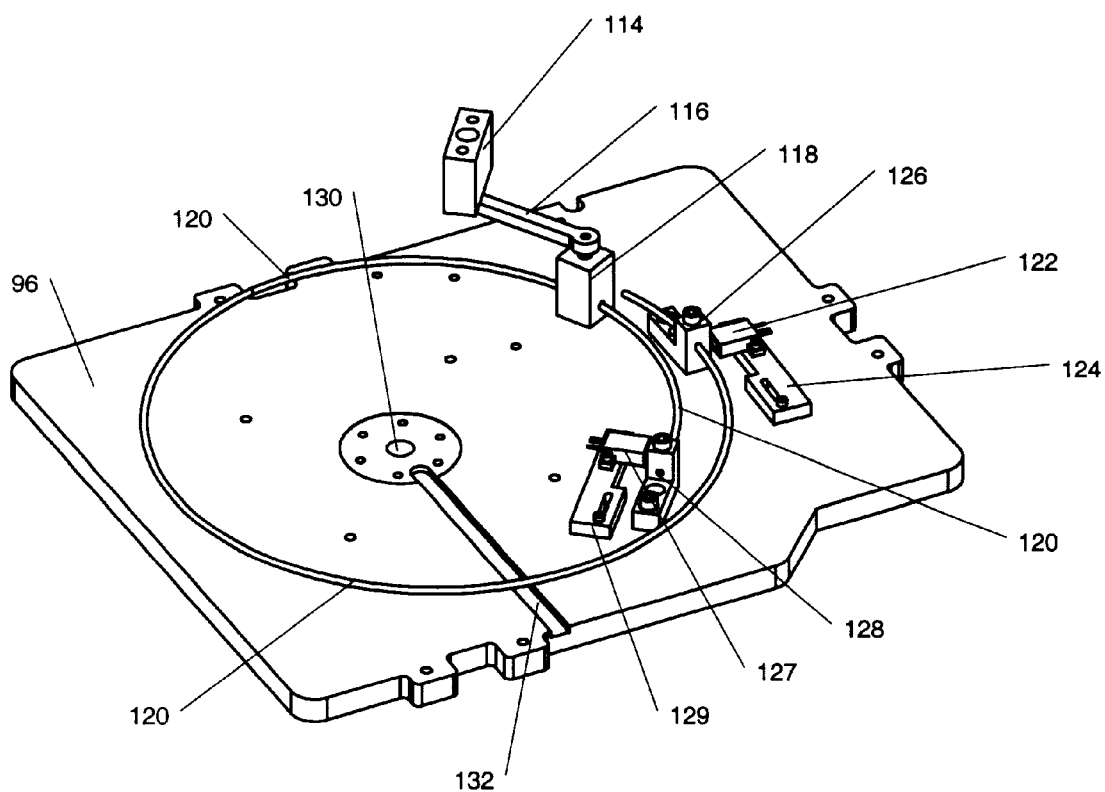
FIG. 7 is a perspective view of the floor of the process chamber including the guide and stopping mechanisms for the rotating mechanism.

FIG. 7 is a perspective view of the components used to rotate, guide and stop the rotation of a rotating mechanism such as the drum 42. In one embodiment, the components are mounted on the floor 96 of the process chamber 26. The floor includes a hole 130 for the motor 80 (FIG. 2A) to rotate the drum 42 (FIG. 3) as well as a passageway 132 for the electrical cables such as those associated with the motor 80. As shown in FIGS. 3 and 7, the block follower 114 pivots at the lower cover 46 (FIG. 2A) of the drum 42 and at the pivot point of an arm follower 116, which in turn pivots on a block follower guide 118. The block follower guide 118 includes an aperture, which permits it to slide with respect to a guide wire 120. The guide wire 120 includes a reflective sensor 122, held by a reflective sensor bracket 124, which detects when the block follower guide 118 is adjacent with the sensor 122, which provides a control signal to stop the motor 80 rotating the drum 42. The opposite ends of the guide wire 120 include a reflective sensor 127, held by a reflective sensor bracket 129, which detects when the block follower guide 118 is adjacent with the sensor 127, which provides a control signal to stop the motor 80 rotating the drum 42. The system also provides a hard stop 128 to backup the sensor 127.

Figure 8:
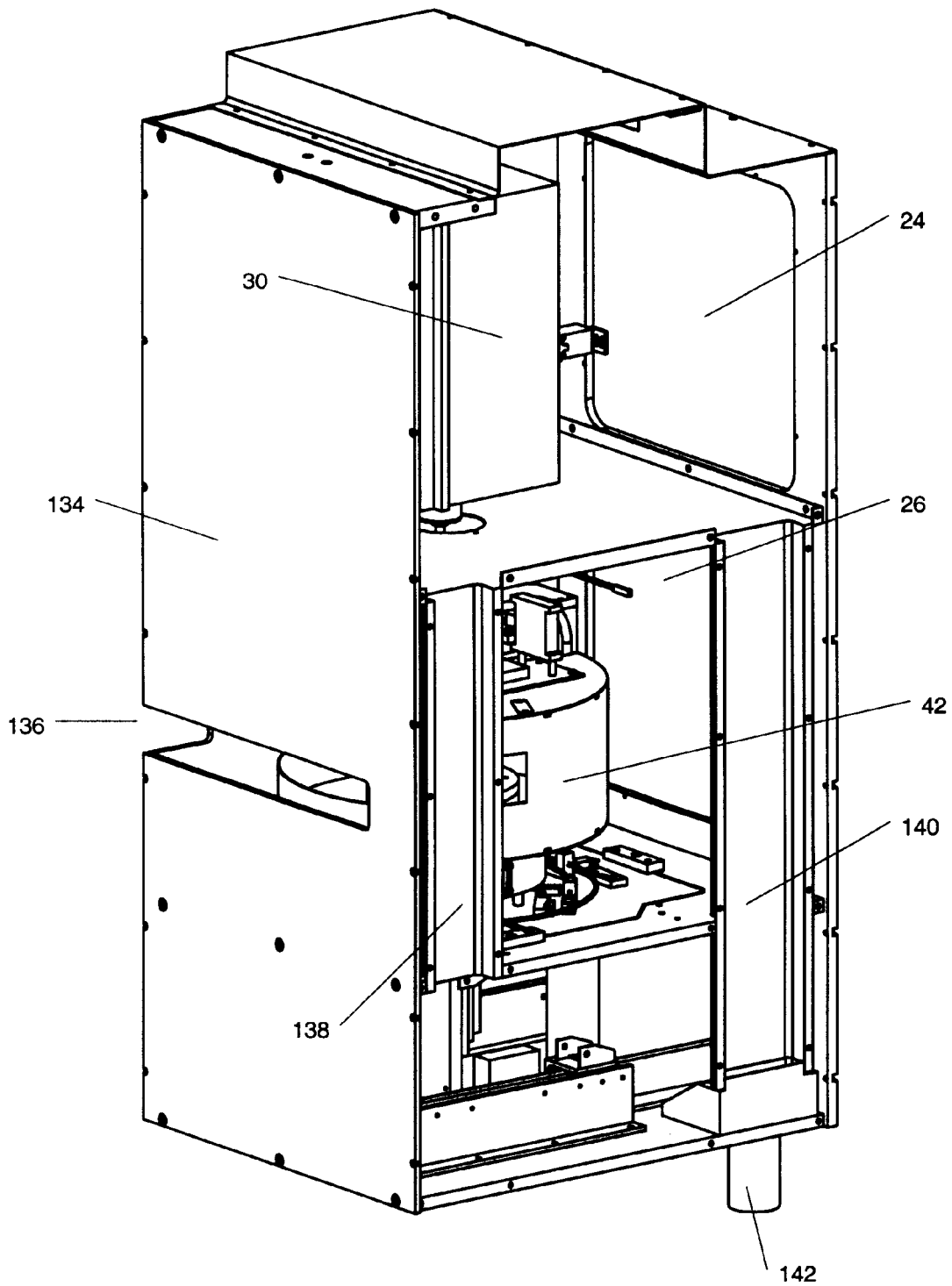
FIG. 8 is a perspective view of the system of FIG. 1 showing air and wire ducts.

FIG. 8 is a perspective view of the system shown in FIGS. 1–2 with an enclosure wall 134 with a wafer passage 136, the inner enclosure 30, the drum 42, a wire duct 138, and the duct 140 providing passage for electrical utilities and heat removal from the exposure source chamber 24 and control chamber 26 to the exhaust 142.

Figure 9:
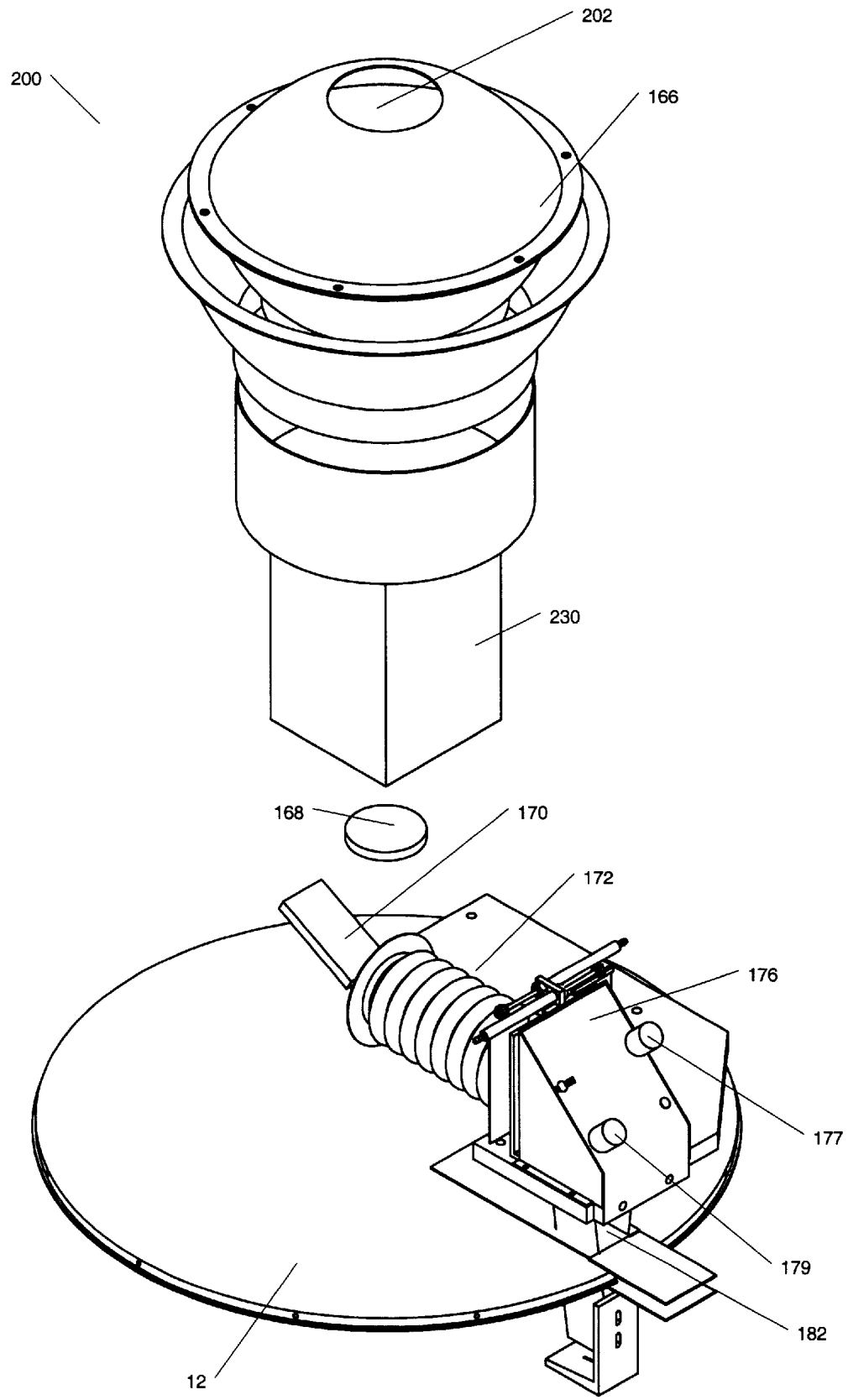
FIG. 9 is an alternate embodiment of the guide for delivering radiation from an exposure source to a wafer.
Figure 12:
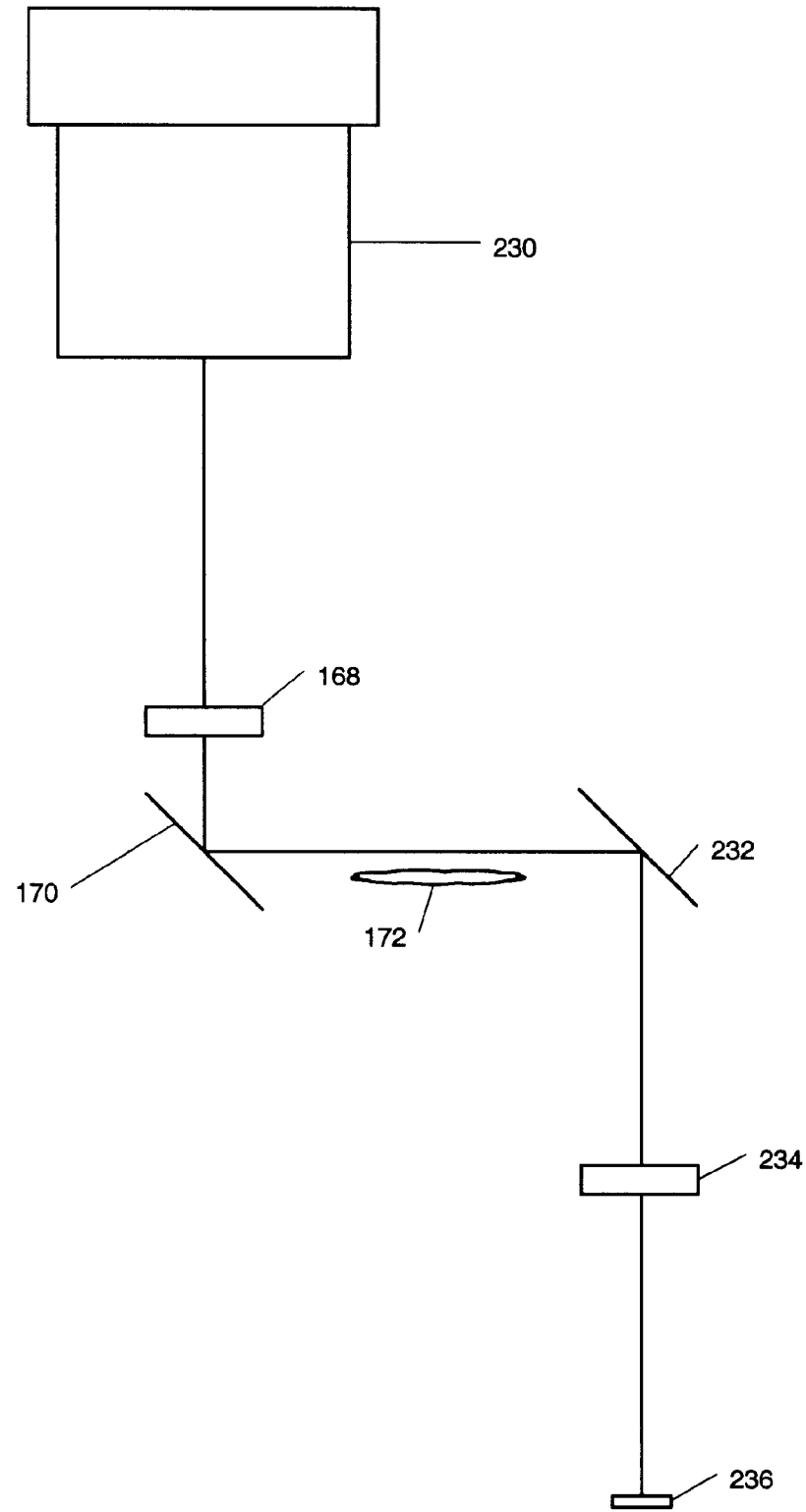
FIG. 12 is a schematic of the optical system employed in the embodiment shown in FIG. 9.

An alternative guide shown in FIGS. 9 and 12 includes a light reflective assembly 200, which delivers light (e.g., UV) from a lamp house-integrating sphere 166 through an optical system to the wafer 12. The integrating sphere 166 gathers energy from a lamp such as a 200-Watt mercury lamp (not shown), which is inserted into the integrating sphere 166 through hole 202, and preferably disposed at the focal point of the integrating sphere 166. This helps compensate for the optical transmission losses from the lamp to the wafer 12. As shown by FIGS. 9 and 12, the light from the integrating sphere 166 travels through a light shield 230 and is collimated by an upper lens 168. A reflecting mirror 170 reflects the collimated light, and is curved to narrow the light to a line beam. The line beam travels through the bellows 172 on its way to a conventional housing 176 containing a conventional filter and a beam turning mirror 232 whose orientation can be adjusted by turning a set of mirror knobs 177 and 179 and/or a lower lens 234. The bellows 172 expands and contracts as the tracking exposure head 40 (FIG. 1) moves across the wafer 12 in the radial direction. As shown, the beam turning mirrors 170 and 232 and the lenses 168 and 234 redirect the light into a light column 182 formed by an aperture 236 in the bottom of the housing 176 to expose the resist on the wafer 12. One suitable light reflective assembly 200 is OAI part no. 0860-055-01. CVI of Livermore, Calif. provides a suitable upper lens 168 (e.g., CVI part no. RCX 49.0-38.1-UV245-390), lower lens 234 (e.g., CVI part no. RCX 40.0-19.1-UV245-390 coated), and beam turning mirrors 170 and 232 (e.g., CVI part no. TLM 248/365-45 UNP-RW 50.0-30.0-5.0) having an UV-enhanced dielectric on their reflector front surface.

Figure 10:
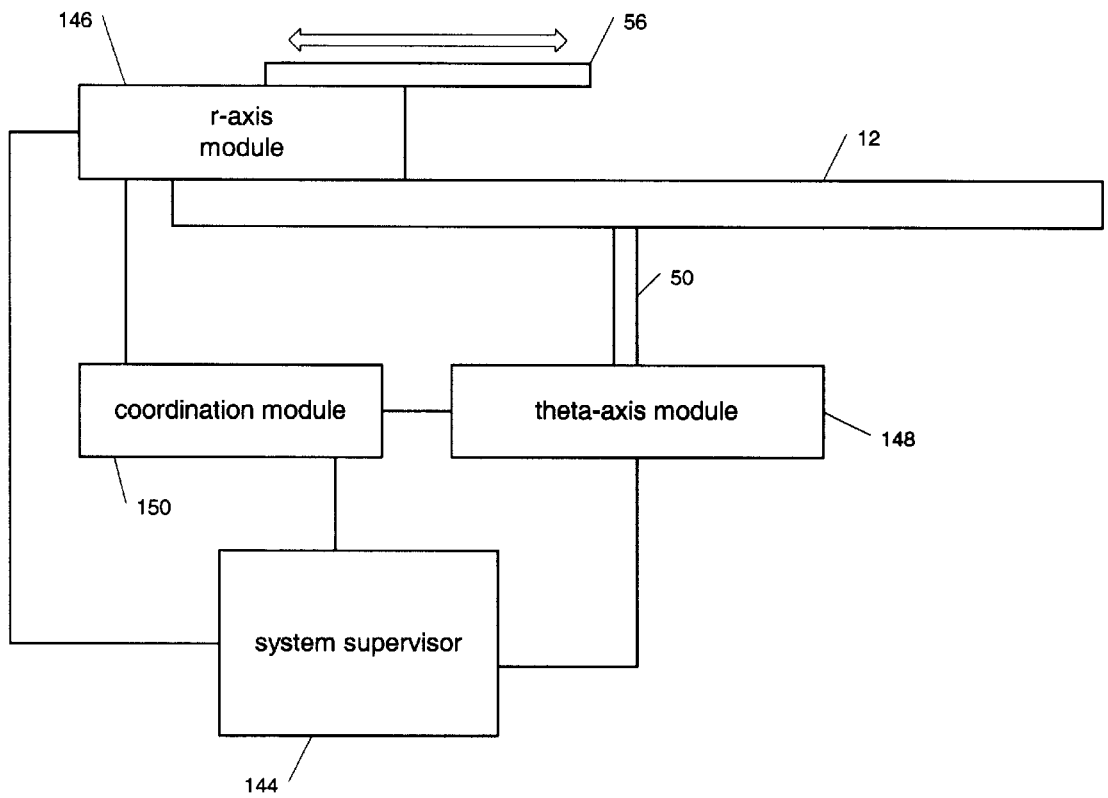
FIG. 10 is a block diagram illustrating an embodiment of the control system.

FIG. 10 is a block diagram of an embodiment of the control system, which includes four modules: a system supervisor 144, an r-axis module 146, a theta-axis module 148, and a coordination module 150. The system supervisor 144 performs high-level control functions, while modules 146, 148, and 150 perform low-level motion control functions. The system supervisor 144 receives recipes from an external host such as the SVG Pro Cell Host Computer through, for example, RS-232 serial communications, and directs the low-level modules 146, 148, and 150 to perform the exposure routine specified by the recipe. The low-level modules 146, 148, and 150 perform real-time control functions so that communication between the system supervisor 144 and the low-level modules 146, 148, and 150 is not time-critical. Consequently, conventional serial communication can be used between the system supervisor 144 and the other modules 146, 148, and 150 reducing wiring complexity. The system supervisor 144 is preferably implemented with a single-board computer 68 (FIG. 1), so that it is compact, easy to program and may employ standard computer peripherals such as a hard drive and floppy drive if desired.

The details of the operation of the motion control system are explained in connection with FIGS. 10–11. The theta-axis module 148 is responsible for control of the drum 42, which rotates the emitter 41 providing the exposure beam around the wafer 12. The theta-axis module 148 is constructed from a conventional rotary stage, which includes the motor 80, a rotary encoder and control electronics.

The coordination module 150 is responsible for coordinating the motion of the r-axis controller with that of the theta axis. The coordination module 150 monitors the theta-axis position by connecting to the theta-axis rotary encoder, which generates a series of pulses indicating the theta-axis position for the r-axis controller. One pulse is generated each time the theta-axis rotates through a small angle. The coordination module 150 also captures the theta-position when the r-axis controller detects a notch or flat. This allows the system supervisor 144 to determine the notch or flat location by reading the captured theta position.

The primary function of the r-axis module 146 is to control the radial mechanism 56 to move the emitter 41 for the appropriate exposure depth during travel along the edge of the wafer 12. The r-axis module 146 controls the power delivered to the motor 108 to move the emitter 41 in the radial direction. The exposure beam position is determined with the linear encoder 106, and the LED 58 and the CCD sensor 59 detect the wafer edge position so that the measured wafer edge position is relative to the exposure beam position rather than an absolute position. The LED 58 is used for illuminating the CCD sensor 59 rather than radiation from the emitter 41 so the edge position may be determined without exposing the wafer 12. The CCD sensor 59 is preferably not directly opposite the exposure beam either because the exposure beam may be too intense for the CCD sensor 59. In one embodiment, the CCD sensor 59 leads the exposure beam by a small offset such as 8 mm. Consequently, the immediate data from the CCD sensor 59 corresponds to a position ahead of the emitter 41.The embodiment uses a memory such as a first-in-first-out (FIFO) buffer 156 (FIG. 11) to store incoming data from the CCD sensor 59 until the exposure beam reaches the same point on the periphery of the wafer 12, which correlates with the CCD data. The coordinating signal generated by the coordination module 150 governs the shifting of data through the FIFO buffer 156. The FIFO buffer 156 is shifted one position with each pulse of the signal. By calibrating the theta-axis distance between pulses, the data leaving the FIFO buffer 156 can be matched with the immediate position of the emitter 41.

Since the CCD sensor 59 moves with the tracking head 40, the CCD data is dependent on the immediate position of the tracking exposure head 40. For example, if the tracking head 40 moves inward in the radial direction 10 mm, the CCD sensor 59 will see 10 mm more of the wafer 12, that is, the wafer 12 will further block the amount of light from the LED 58 captured by the CCD sensor 59. The invention compensates for this dependency by subtracting the radial position, as measured by the encoder 106, from the CCD data. The resulting data is independent of the position of the tracking exposure head 40. This compensated data is then stored in the FIFO buffer 156 as previously described.

Figure 11:
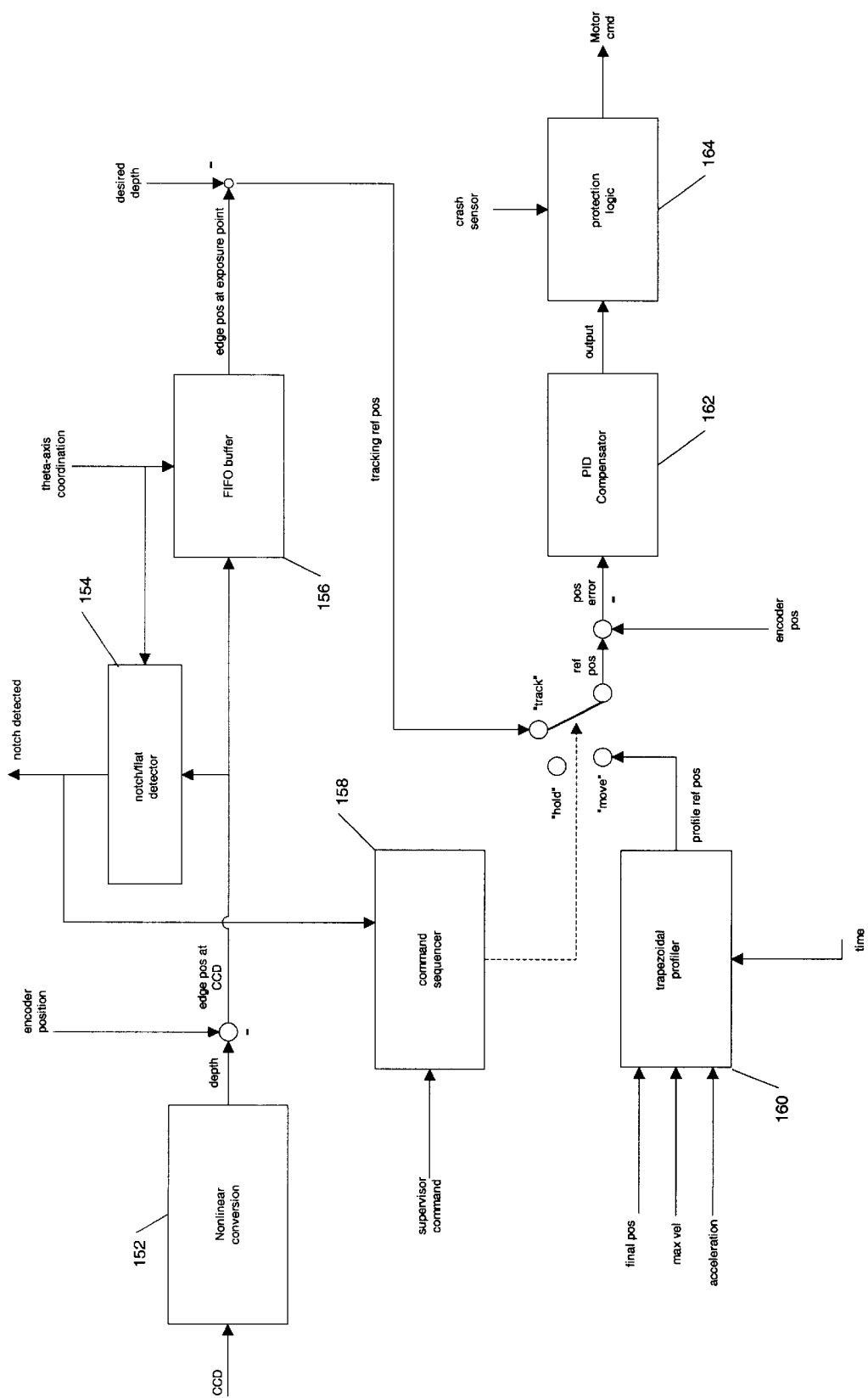
FIG. 11 is a block diagram of the r-axis module of the control system.

FIG. 11 illustrates the functionality of the r-axis servo controller PCB 74. The PID compensator 162 represents a closed loop position controller to drive the r-axis module 146 to the position specified by the ref position signal. This is achieved using conventional PID compensation techniques, which determine the instantaneous motor command by combining the instantaneous position error, with the integral of the error, and the derivative of the error.

Ref position is the desired position for the motor 108, e.g., the Nanomotion motor, at any point in time. It is generated by the controller according to the current mode of operation. For a simple point-to-point move, ref is based on the desired acceleration, velocity, final position and time. For edge tracking, ref position is based on wafer edge position and desired exposure depth. The controller uses the ref position to determine the output to the motor 108. Ideally the motor would always be exactly at the ref position, but in practice it deviates due to the inertia of the motor/load, controller limitations, external forces on the motor, and other factors.

Before a command is sent to the motor 108, crash protection logic 164 checks crash sensor 61, a photoelectric break beam detector, OAI part no. 0860-0044-01 to determine if there is an obstruction in the path of the exposure tracking head 40. If a crash is impending, the control system uses the signal to command the motor 108 to inhibit movement in that direction to avoid damage to the system 10.

The remaining blocks in the FIG. 11 are responsible for generating the ref position based on the commands received from the system supervisor 144. The command sequencer 158 receives high-level commands from the system supervisor 144 by conventional serial communications such as RS-232. The command sequencer 158 executes the high-level commands, such as find and track wafer edge or move to home position, by switching between three basic modes of control. The modes are tracking, move and hold, and each of these generates the ref position signal in a different manner. The hold mode maintains a constant reference position so that the position of the motor 108 is held constant. The hold mode is typically used when the r-axis reaches its final destination.

The tracking mode is used when the radial mechanism 56 must maintain a fixed distance from the edge of the wafer 12, such as when exposing the edge of the wafer 12. The tracking mode uses data from both the CCD sensor 59 and the linear encoder 106 to generate the ref position.

The output of the CCD sensor 59 is not linear with respect to wafer position because the angle of incidence of illuminating light from the LED 58 is not constant over the length of the CCD. The CCD sensor output is made linear by nonlinear conversion 152. Since the CCD measurement is not taken at the point of exposure, the data is sent though the FIFO buffer 156 as previously described. The position coming out of the FIFO buffer 156 corresponds to the absolute wafer edge position at the point of exposure. The desired depth is then subtracted from the edge position to give the desired position for the exposure beam from the emitter 41. Finally, the ref position is set equal to this desired exposure position, so the linear motor 108 is moved to the proper exposure position.

The third mode of control is the move mode. This is used to move the radial mechanism 56 to a desired destination. For example, when the exposure of the wafer 12 is complete, the system supervisor 144 commands the r-axis module 146 to move away from the wafer edge to an idle position. In order to obtain a smooth, controlled move to the final destination, the reference position is updated over time according to a trapezoidal velocity profile block 160. This means the ref position is changed in small increments to reach the final position, rather than abruptly changing the ref position. A trapezoidal velocity profile has characteristics of a constant acceleration up to a maximum velocity, a constant velocity during translation, and a constant deceleration to the final position. The trapezoidal profiler block 160 in the lower-left of FIG. 11 is responsible for generating the time-varying ref-position according to the final position, velocity and acceleration specified by the system supervisor 144.

The notch/flat detector 154 detects a notch or flat on the wafer 12 so that its position can be determined. The r-axis module 146 uses the CCD measurements and the coordinating pulses from the coordination module 105 to calculate the curvature of the wafer edge. The corner of a notch or flat has a relatively large curvature, so the notch/flat detector 154 detects the notch or flat of the wafer 12 based on a curvature calculation. When a notch or flat is detected, the r-axis module 146 sends a signal to the coordination module 150, which immediately captures the current theta-position of the rotating drum 42.

Some applications require that the exposed periphery not dip at a notch of the wafer 12, which happens if a constant exposure depth is maintained all the way around the wafer 12. Since the edge of the wafer 12 is not mapped, the r-axis module 146 should preferably skip over the notch without needing to know its location. When doing clips, the notch position may be determined before any exposure, but this is not typically done. However, since the CCD sensor 59 preferably leads the exposure beam from the emitter 41 by a small known distance, that is, an offset, the notch can be detected a short time before it is exposed. Once the notch is detected, tracking (i.e., edge detecting) continues up to a point just before the start of the notch. At this point, tracking is suspended and the radial mechanism 56 is held stationary while the drum 42 rotates. The r-axis module 146 is configured to hold a constant depth as the exposure beam passes over a notch. Once the exposure beam passes over the notch, the r-axis module 146 resumes tracking the edge of the wafer 12 so that the remainder of wafer 12 is exposed with a constant depth.

Some applications require small regions, called clips, to be exposed for wafer handling purposes. There are typically three to six clips distributed around the edge of wafer 12, at known distances from the notch or flat. The following refers to a notch, but a flat can be treated similarly. Exposing the clips begins by determining the location of the notch or flat. With the lamp of the exposure source assembly 38 turned off, the drum 42 rotates in accordance with the theta-axis module 148, while the r-axis module 146 tracks the wafer edge. When the CCD sensor 59 passes over the notch or flat, the notch or flat position is captured, and the drum 42 with the tracking exposure head 40 moves back to the home position. Next, the lamp of the exposure source assembly 38 is turned on and the drum 42 with the emitter 41 is rotated to expose up to the beginning of the first clip. The recipe provides information to determine the start and stop position of each clip with respect to the notch or flat. Prior to turning on the exposure source of the exposure source assembly 38, the apparatus scans the wafer edge to determine notch location with respect to the home position. The apparatus can then use the recipe to determine the start/stop positions of clips with respect to the home position.

With the rotation stopped, the radial mechanism 56 moves the emitter 41 to the clip exposure depth and the rotation continues through the length of the clip. The recipe specifies a clip size (either in an angle or arc length). This is converted to a rotational distance for the rotary motor 80. The rotary motor 80 is simply commanded to move this distance to expose the clip. The radial mechanism 56 moves the emitter 41 back out to the depth of the periphery where there are no clips and the process continues until the entire periphery of the wafer 12 is exposed. When the exposure is completed, the exposure source is turned off and the emitter 41 is rotated back to the home position.

Alternatively, the position of the notch can be captured and the emitter 41 can be turned on to expose the periphery including clips immediately after and the emitter 41 returned to the home position and the remaining periphery with any clips exposed up to the notch or flat.

What is claimed is:

1. A system of exposing material on a substrate periphery, comprising:
   an exposure source assembly coupled to a guide emitting at the periphery;
   an edge detector for detecting and generating signals indicative of the substrate edge;
   a transport for moving the guide along the periphery of the substrate during exposure; and
   a control system processing the signals and commanding the transport to move so as to expose the periphery in accordance with the signals.

2. The system of claim 1, wherein the guide includes a fiber optic and/or catadioptric assembly.

3. The system of claim 1, wherein the transport includes rotating and radial mechanisms for moving the guide over the substrate.

4. The system of claim 1, wherein the transport includes a tracking exposure head supporting the guide and the edge detector.

5. The system of claim 3, further comprising guidance and stopping mechanisms for the rotating and the radial mechanisms.

6. The system of claim 4, wherein the rotating mechanism supports the radial mechanism, which supports the tracking exposure head.

7. The system of claim 4, wherein the rotating mechanism is a drum housing the substrate and supporting the radial mechanism supporting the tracking exposure head holding the edge detector and the guide adjacent the substrate.

8. A system for exposing the periphery of a substrate, comprising:
   a chamber housing an exposure source;
   a process chamber housing:
      a substrate on a support, and
      a transport with an edge detector and an emitter;
   a guide coupling the exposure source to the emitter; and
   a control system receiving signals indicative of the substrate edge from the detector and directing the transport along the periphery of the substrate in accordance with the edge signals.

9. The system of claim 8, wherein the control chamber houses a main control system and the exposure source chamber includes an inner enclosure housing the exposure source.

10. The system of claim 9, further comprising a duct removing heat generated by the exposure source assembly and the main control system.

11. The system of claim 8, wherein the transport includes a mechanism for rotating the emitter along the periphery, a mechanism for radial movement of the emitter over the substrate, and a tracking exposure head supporting the emitter and the edge detector.

12. The system of claim 11, wherein the rotating and the radial mechanisms move the emitter and the edge detector subject to guidance and stopping mechanisms.

13. The system of claim 11, wherein the rotating mechanism supports the radial mechanism, which supports the tracking exposure head.

14. The system of claim 11, wherein the rotating mechanism is a drum, which supports the radial mechanism, which supports the tracking exposure head holding the edge detector and the emitter adjacent the substrate.

15. A method of exposing radiation sensitive material on the periphery of a substrate, comprising:

placing the substrate on a stationary support;

exposing the material on the periphery by moving an exposing beam along the periphery of the stationary substrate;

detecting the substrate edge and generating edge signals by moving a detector along the periphery of the stationary substrate; and controlling the depth of exposure according to the edge signals.

16. The method of claim 15, further comprising storing of the edge signals in memory in a sequence and reading the edge signals in the sequence.

17. The method of claim 15, further comprising isolating the substrate, the support, the detector, and the emitting end from the exposure source.

18. The method of claim 15, wherein the substrate is a wafer, the radiation sensitive material is photoresist, and the wafer is held stationary during the steps of detecting the edge and exposing the photoresist on the periphery.

19. The method of claim 18, wherein the detector and exposure source rotate about the wafer and move in the radial direction when necessary to exposure the periphery of the wafer.

20. A method of controlling exposure of a wafer periphery, which relies upon storing data in a computer that represents various types of mechanical movements of the emitter, comprising:

using a computer processor to calculate the angular position of an exposure beam with respect to a wafer reference;

rotating a sensor to determine the edge of the wafer;

calculating the edge as a function of angular position;

storing in a memory the edge and corresponding angular position; and reading from memory the edge and angular positions to adjust the beam exposing the periphery of the wafer.

21. A system of exposing material on the periphery of a substrate, comprising:

an exposure source assembly coupled to a catadioptric assembly with an emitter directing radiation at the periphery;

a detector for locating the substrate edge and generating signals indicative of the location;

a transport for moving the emitter along the periphery; and a control system, wherein the edge detector sends signals to the control system, which processes the signals and controls the transport moving the emitter to expose the periphery.

22. A system for exposing the periphery of a substrate, comprising:

a chamber housing an exposure source;

a process chamber housing:

a substrate support, and a transport with an edge detector and an emitter, wherein the transport includes a mechanism for rotating the emitter along the periphery, a mechanism for radial movement of the emitter over the substrate, and a tracking exposure head supporting the emitter and the edge detector;

a guide coupling the exposure source to the emitter; and a control system receiving signals indicative of the substrate edge from the detector and directing the transport along the periphery of the substrate in accordance with the edge signals.

23. The system of claim 22, wherein the rotating and the radial mechanisms move the emitter and the edge detector subject to guidance and stopping mechanisms.

24. The system of claim 22, wherein the rotating mechanism supports the radial mechanism, which supports the tracking exposure head.

25. The system of claim 22, wherein the rotating mechanism is a drum, which supports the radial mechanism, which supports the tracking exposure head holding the edge detector and the emitter adjacent the substrate.

* * * * *